(12) United States Patent
Okawa et al.

(10) Patent No.: US 9,831,900 B2
(45) Date of Patent: Nov. 28, 2017

(54) WIRELESS COMMUNICATION DEVICE

(71) Applicant: FUJITSU LIMITED, Kawasaki-shi, Kanagawa (JP)

(72) Inventors: Yasuhiro Okawa, Sendai (JP); Takumi Takayashiki, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/079,652

(22) Filed: Mar. 24, 2016

(65) Prior Publication Data
US 2016/0322992 A1  Nov. 3, 2016

(30) Foreign Application Priority Data

May 1, 2015  (JP) .................................. 2015-094099

(51) Int. Cl.
H04B 1/04 (2006.01)
H03F 1/32 (2006.01)
H04L 27/36 (2006.01)
H04B 15/00 (2006.01)

(52) U.S. Cl.
CPC ......... H04B 1/0475 (2013.01); H03F 1/3241 (2013.01); H04B 15/00 (2013.01); H04L 27/367 (2013.01); H04B 2001/0408 (2013.01); H04B 2001/0433 (2013.01)

(58) Field of Classification Search
CPC ..... H04L 27/367; H03F 1/3241; H04B 15/00; H04B 1/0475; H04B 2001/0433; H04B 2001/0408
See application file for complete search history.

(56) References Cited

U.S. PATENT DOCUMENTS

| | | | | |
|---|---|---|---|---|
| 4,564,816 A | * | 1/1986 | Kumar | ................. H03F 1/3241 327/100 |
| 6,316,983 B1 | * | 11/2001 | Kitamura | ............. H03F 1/3241 327/306 |
| 6,359,508 B1 | * | 3/2002 | Mucenieks | .......... H03F 1/3229 330/149 |
| 7,197,286 B2 | * | 3/2007 | Ode | ..................... H03F 1/3258 375/297 |

(Continued)

FOREIGN PATENT DOCUMENTS

| | | |
|---|---|---|
| JP | 2006-197545 | 7/2006 |
| JP | 2009-545250 | 12/2009 |

(Continued)

Primary Examiner — Jean B Corrielus
(74) Attorney, Agent, or Firm — Fujitsu Patent Center

(57) ABSTRACT

A wireless communication device includes an antenna, a DPDC, an amplifier, a coupler, and a bias output unit. The DPDC performs distortion compensation on a transmission signal based on a feedback signal. The amplifier amplifies the transmission signal subjected to the distortion compensation by the DPDC. The coupler splits the transmission signal amplified by the amplifier into a transmission signal output to the antenna and the feedback signal input to the DPDC. The DPDC measures an index based on a reflected wave obtained by reflection of the transmission signal split by the coupler from the antenna. The bias output unit applies a bias voltage for controlling an efficiency of an amplifier to the amplifier in accordance with the index measured by the DPDC.

6 Claims, 14 Drawing Sheets

(56) References Cited

U.S. PATENT DOCUMENTS

| | | | | |
|---|---|---|---|---|
| 7,408,408 B2* | 8/2008 | Kang | .................... | H03F 1/3276 |
| | | | | 330/149 |
| 8,891,974 B2* | 11/2014 | Wang | .................... | H04B 10/58 |
| | | | | 398/115 |
| 2001/0052816 A1* | 12/2001 | Ahn | ..................... | H03F 1/3247 |
| | | | | 330/149 |
| 2005/0258898 A1* | 11/2005 | Hongo | ................. | H03F 1/3241 |
| | | | | 330/149 |
| 2008/0026710 A1 | 1/2008 | Buckley | | |
| 2012/0249236 A1* | 10/2012 | Langer | ................. | H03F 1/0272 |
| | | | | 330/127 |
| 2014/0118068 A1 | 5/2014 | Kawasaki et al. | | |
| 2015/0236732 A1* | 8/2015 | Nath | .................... | H04B 1/0475 |
| | | | | 455/114.3 |
| 2016/0049907 A1* | 2/2016 | Baker | ....................... | H03F 1/56 |
| | | | | 330/296 |

FOREIGN PATENT DOCUMENTS

| | | |
|---|---|---|
| JP | 2014-090299 | 5/2014 |
| WO | 2008014210 | 1/2008 |

* cited by examiner

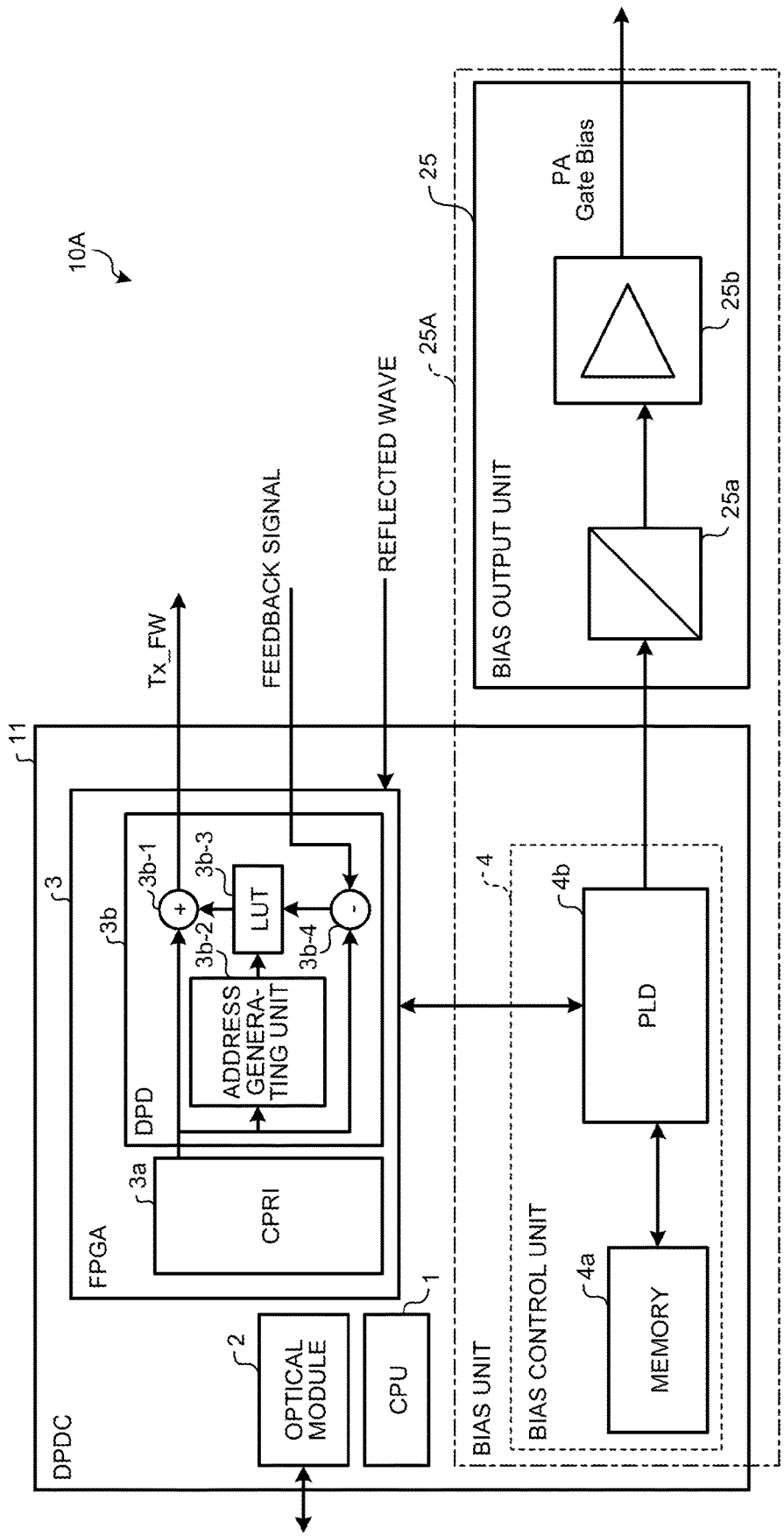

FIG.3A

| VSWR | PA-Vg | MEMORY ADDRESS |
|---|---|---|
| 1.0 TO 1.1 | -3.5 V | SAVE 1 |
| 1.1 TO 1.2 | -3.4 V | SAVE 2 |
| 1.2 TO 1.3 | -3.3 V | SAVE 3 |
| ... | ... | ... |

FIG.3B

| VSWR | PA-Vg | MEMORY ADDRESS |
|---|---|---|
| 1.0 TO 1.1 | 0.5 V | SAVE 1 |
| 1.1 TO 1.2 | 0.8 V | SAVE 2 |
| 1.2 TO 1.3 | 1.1 V | SAVE 3 |
| ... | ... | ... |

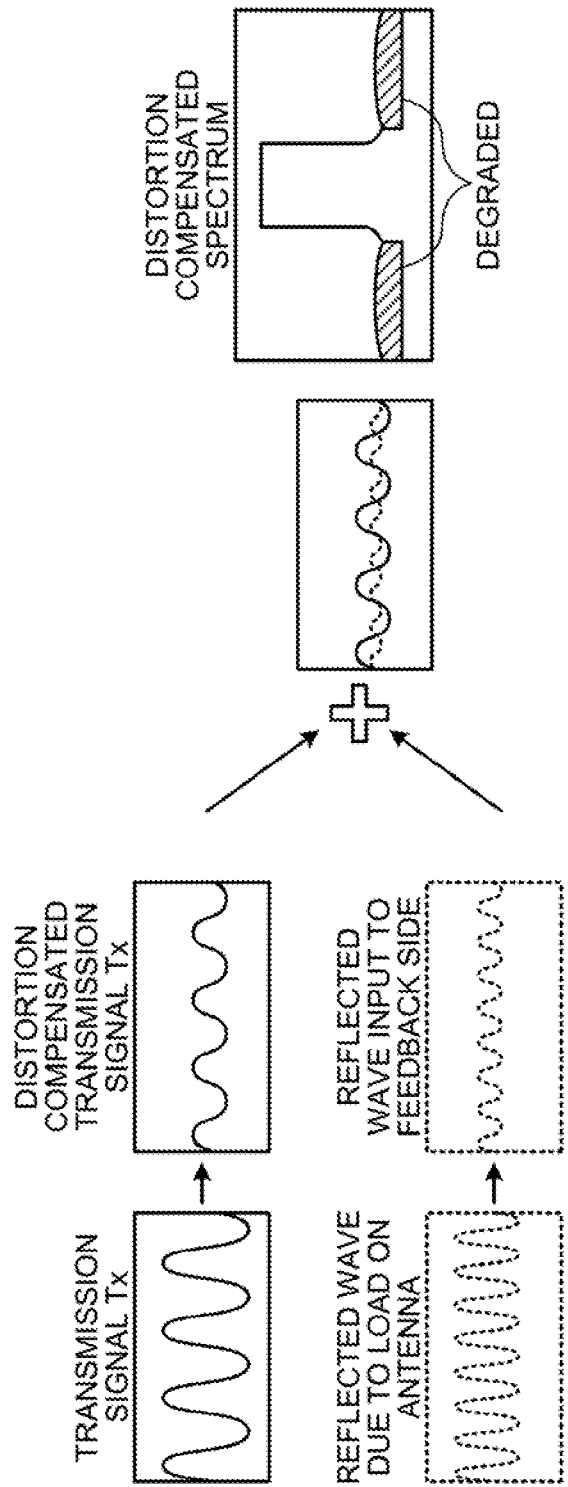

WIRELESS COMMUNICATION DEVICE

CROSS-REFERENCE TO RELATED APPLICATION

This application is based upon and claims the benefit of priority of the prior Japanese Patent Application No. 2015-094099, filed on May 1, 2015, the entire contents of which are incorporated herein by reference.

FIELD

The embodiments discussed herein are related to a wireless communication device.

BACKGROUND

Conventionally, in carrier wireless communication, a base station device that is a wireless communication device is provided with an amplifier that amplifies a transmission signal. The transmission signal amplified by the amplifier generally includes nonlinear distortion. Therefore, the base station device sends, via an antenna, a transmission signal subjected to distortion compensation to compensate for the nonlinear distortion. FIG. 13A is a block diagram illustrating an example of a base station device according to a conventional technology. FIG. 13A illustrates only blocks related to distortion compensation of the transmission signal and sending from the antenna, and other blocks are omitted.

For example, as illustrated in FIG. 13A, a base station device 10 according to the conventional technology includes a digital pre distortion controller (DPDC) 110 and an amplifier 160. The DPDC 110 performs distortion compensation on a transmission signal input to the amplifier 160 so that distortion of the transmission signal to be output from the amplifier 160 can be reduced. The transmission signal output from the DPDC 110 is converted to a radio frequency (RF) signal by a block including a digital-to-analog (DA) converter 120, a mixer 130, a phase locked loop (PLL) 140, and an amplifier 150, and input to the amplifier 160.

Then, the transmission signal amplified by the amplifier 160 is sent from an antenna 100 via a block including a coupler 170, an isolator 180, a duplexer 190, and a coupler 200. Furthermore, the transmission signal amplified by the amplifier 160 is split by the coupler 170, and input, as a feedback signal, to a switch 210. The feedback signal input to the switch 210 is converted to a baseband signal by a block including a mixer 220, a PLL 230, and an analog-to-digital (AD) converter 240, and input to the DPDC 110. The feedback signal is input to the DPDC 110 through a route 1 illustrated in FIG. 13A. The DPDC 110 performs distortion compensation on the transmission signal based on the feedback signal so that a distortion value of the transmission signal amplified by the amplifier 160 can be reduced.

In addition, the DPDC 110 detects a reflected wave coming from the antenna 100 through a route 3 illustrated in FIG. 13A, monitors a voltage standing wave ratio (VSWR), and detects an abnormality of the antenna 100. The DPDC 110 detects an abnormality of the antenna 100 on the basis of the VSWR based on the reflected wave input via a block including the coupler 200, the switch 210, the mixer 220, the PLL 230, and the AD converter 240. Incidentally, the base station device 10 switches between input from the coupler 170 to the DPDC 110 and input from the coupler 200 to the DPDC 110 by using the switch 210; however, input from each of the couplers may independently be input to the DPDC 110.

Patent Literature 1: Japanese Laid-open Patent Publication No. 2006-197545
Patent Literature 2: Japanese National Publication of International Patent Application No. 2009-545250
Patent Literature 3: Japanese Laid-open Patent Publication No. 2014-090299

In some cases, due to a change in a load state of the antenna 100, the transmission signal output from the amplifier 160 may be reflected from the antenna 100. If the transmission signal is reflected from the antenna 100, a reflected wave may be input to the switch 210 through a route 2 illustrated in FIG. 13A. In this case, the DPDC 110 performs distortion compensation based on a signal, in which a feedback signal of the transmission signal and the reflected wave are superimposed. Specifically, even if the characteristics of the transmission signal at an output end of the amplifier 160 is set to an optimum value, a divergence between the transmission signal and the feedback signal occurs depending on the load state of the antenna 100 connected to the base station device 10, and distortion included in the transmission signal may be increased.

For example, as illustrated in FIG. 13A, the DPDC 110 performs distortion compensation based on the feedback signal, in which the reflected wave obtained through the route 2 is superimposed on the transmission signal obtained through the route 1, so that a divergence between the transmission signal and the feedback signal occurs. Consequently, in the above-described technology, as illustrated in FIG. 13B, distortion included in the transmission signal subjected to the distortion compensation is increased, and the quality of the transmission signal is reduced.

SUMMARY

According to an aspect of an embodiment, a wireless communication device includes, an antenna, a distortion compensating unit that performs distortion compensation on a transmission signal based on a feedback signal, an amplifying unit that amplifies the transmission signal subjected to the distortion compensation by the distortion compensating unit, a splitter that splits the transmission signal amplified by the amplifying unit into a transmission signal output to the antenna and the feedback signal input to the distortion compensating unit, a measuring unit that measures an index based on a reflected wave obtained by reflection of the transmission signal split by the splitter from the antenna, and a voltage applying unit that applies a bias voltage for controlling an efficiency of the amplifying unit in accordance with the index measured by the measuring unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a block diagram illustrating an example of a DPDC and a bias output unit according to the first embodiment;

FIG. 3A is a diagram illustrating an example of correspondence between a VSWR and a bias value according to the first embodiment;

FIG. 3B is a diagram illustrating another example of correspondence between the VSWR and the bias value according to the first embodiment;

FIG. 13B is a diagram for explaining distortion compensation according to the conventional technology.

DESCRIPTION OF EMBODIMENTS

Preferred embodiments of the present invention will be explained with reference to accompanying drawings. In the descriptions of the embodiments below, the same components and the same processes as those of the other embodiments and the conventional technology will be denoted by the same reference signs, and the same explanation will not be repeated unless the components and the processes are described for the first time. The disclosed technology is not limited by the embodiments below. The embodiments may be combined appropriately as long as the processing contents do not conflict with each other.

[a] First Embodiment

Figure 1:
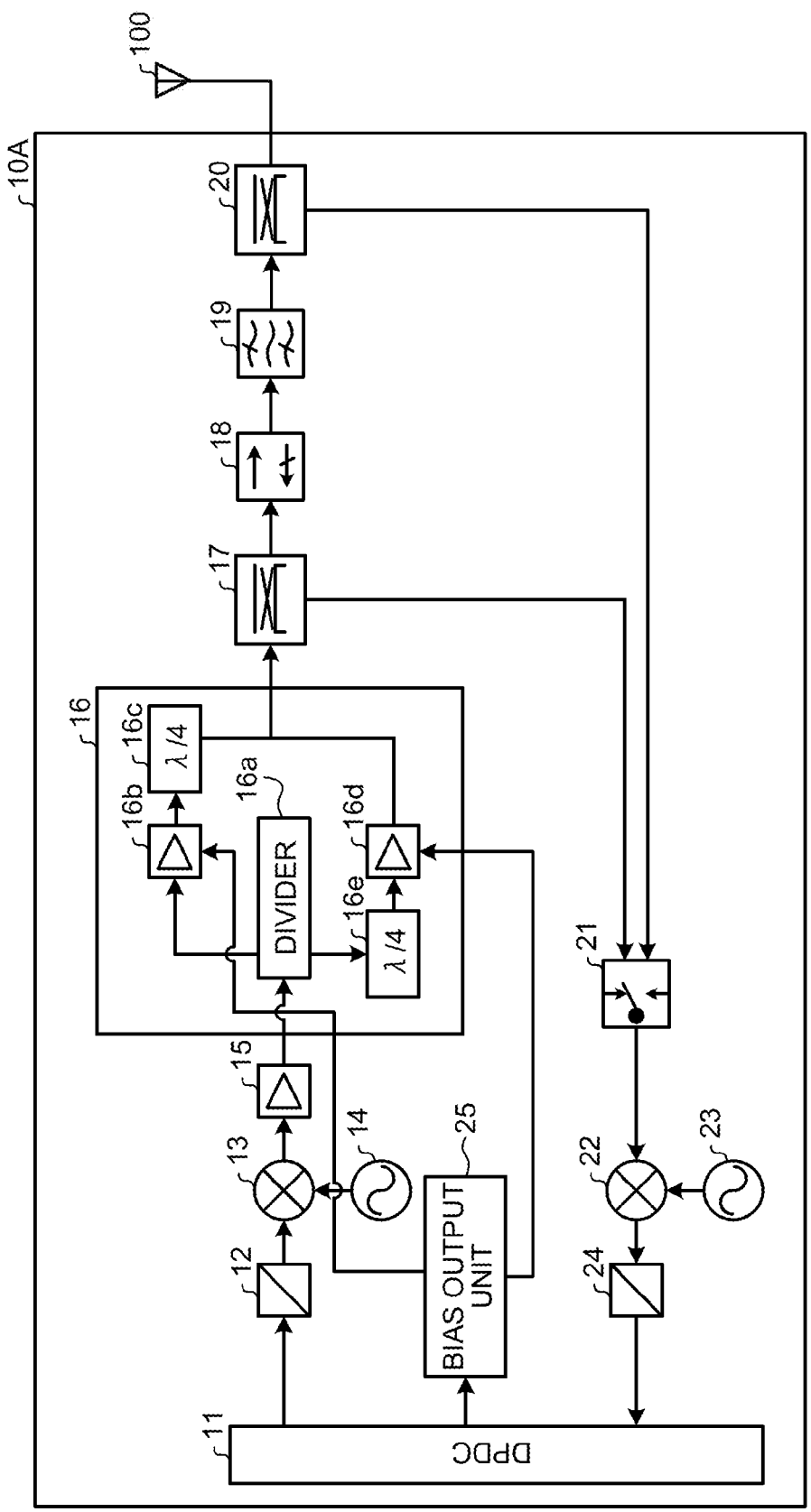
FIG. 1 is a block diagram illustrating an example of a base station device according to a first embodiment.

Base station device of first embodiment FIG. 1 is a block diagram illustrating an example of a base station device according to a first embodiment. FIG. 1 illustrates only blocks related to predistortion of a transmission signal, amplification of the transmission signal, and transmission of the transmission signal from an antenna, and other blocks are omitted. A base station device 10A according to the first embodiment includes a DPDC 11, a DA converter 12, a mixer 13, a PLL 14, and an amplifier 15. The base station device 10A further includes an amplifier 16, a coupler 17, an isolator 18, a filter 19, a coupler 20, and an antenna 100. The base station device 10A further includes a switch 21, a mixer 22, a PLL 23, an AD converter 24, and a bias output unit 25.

The DPDC 11 performs distortion compensation on a transmission signal of a baseband, and outputs the transmission signal to the DA converter 12. The DA converter 12 converts the transmission signal from a digital signal to an analog signal, and then outputs the transmission signal to the mixer 13. The mixer 13 performs up-conversion on the transmission signal by using a local oscillation signal output by the PLL 14, and outputs the transmission signal subjected to the up-conversion to the amplifier 15. The amplifier 15 amplifies the transmission signal output from the mixer 13, and then outputs the transmission signal to the amplifier 16.

The amplifier 16 includes a divider 16a, a carrier amplifier 16b, a load adjusting unit 16c, a peak amplifier 16d, and a phase adjusting unit 16e. The divider 16a distributes the transmission signal and outputs distributed signals respectively to the carrier amplifier 16b and the phase adjusting unit 16e. The carrier amplifier 16b amplifies the transmission signal distributed by the divider 16a, and outputs the amplified transmission signal to the coupler 17 via the load adjusting unit 16c. The phase adjusting unit 16e and the peak amplifier 16d operate when electric power of the transmission signal exceeds a predetermined threshold. The phase adjusting unit 16e shifts the phase of the transmission signal distributed by the divider 16a by, for example, 90°. The peak amplifier 16d amplifies the transmission signal whose phase has been shifted by 90° by the phase adjusting unit 16e, and then outputs the transmission signal to the coupler 17.

The coupler 17 splits the transmission signal amplified by the amplifier 16, and inputs signals respectively to the isolator 18 and the switch 21. The isolator 18 causes the transmission signal output from the coupler 17 to pass through the filter 19, and blocks a signal (for example, a reflected wave) flowing from the filter 19 to the coupler 17.

The filter 19 causes the transmission signal subjected to the up-conversion to pass through the coupler 20 in a transmission frequency band. The coupler 20 splits the transmission signal, outputs a split signal to the antenna 100, and outputs a reflected wave from the antenna 100 to the switch 21.

The switch 21 is an RF switch. The switch 21 alternately selects a signal output from the coupler 17 and a signal output from the coupler 20 in a predetermined cycle, and outputs the selected signal to the mixer 22. Incidentally, the signal output from the coupler 17 to the switch 21 is a feedback signal, in which the transmission signal amplified by the amplifier 16 and a reflected wave obtained by reflection of the transmission signal from the antenna 100 are superimposed. Furthermore, the signal output from the coupler 20 to the switch 21 is a reflected wave obtained by reflection of the transmission signal from the antenna 100.

The mixer 22 performs down-conversion on the signal output from the coupler 17 or the coupler 20 into a baseband signal by using a local oscillation signal output by the PLL 23, and outputs the signal subjected to the down-conversion to the AD converter 24. The AD converter 24 converts the signal output from the mixer 22 from an analog signal to a digital signal, and then outputs the signal to the DPDC 11.

The DPDC 11 performs distortion compensation according to a feedback signal when the feedback signal is input from the coupler 17 to the DPDC 11 due to periodical switching by the switch 21.

Furthermore, if a reflected wave from the antenna 100 is input to the DPDC 11 due to periodical switching by the switch 21, the DPDC 11 calculates a VSWR based on the reflected wave from the antenna 100. Specifically, the DPDC 11 calculates the VSWR based on the transmission signal that is input to the DPDC 11 before switching by the switch 21 and based on the reflected wave that is input to the DPDC 11 after switching by the switch 21. The influence of the transmission signal flowing from the filter 19 to the switch 21 is removed by calibration.

Then, the DPDC 11 generates a bias control signal, which is a digital signal corresponding to a bias voltage to be applied to the amplifier 16, on the basis of a value of the calculated VSWR. Then, the DPDC 11 outputs the generated bias control signal to the bias output unit 25.

The bias output unit 25 converts the bias control signal that is a digital signal output from the DPDC 11 to a bias voltage that is an analog signal. Then, the bias output unit 25 applies the converted bias voltage to each of the carrier amplifier 16b and the peak amplifier 16d of the amplifier 16. Consequently, the efficiency of each of the carrier amplifier 16b and the peak amplifier 16d is changed.

In the first embodiment, when the value of the VSWR is large, the DPDC 11 generates a bias control signal corresponding to a bias voltage with which the efficiency of the amplifier 16 is reduced, and, when the value of the VSWR is small, the DPDC 11 generates a bias control signal corresponding to a bias voltage with which the efficiency of the amplifier 16 is increased. Therefore, in the first embodiment, control is performed such that the efficiency of the amplifier 16 is reduced when the value of the VSWR is large, and the efficiency of the amplifier 16 is increased when the value of the VSWR is small.

Incidentally, if the efficiencies of the carrier amplifier 16b and the peak amplifier 16d are increased, distortion of an amplified signal is increased, and if the efficiencies are reduced, distortion of an amplified signal is reduced. In the first embodiment, control is performed such that the efficiency of the amplifier 16 is reduced when the value of the VSWR is large, so that the distortion characteristics of the amplifier 16 is improved. Therefore, it is possible to reduce distortion of the transmission signal, enabling to cancel out an increase in the distortion due to a divergence between the feedback signal including the reflected wave and the transmission signal subjected to the distortion compensation. Consequently, it is possible to prevent a reduction in the quality of the transmission signal due to a change in the characteristics of the antenna 100.

Furthermore, in the first embodiment, control is performed such that the efficiency of the amplifier 16 is increased when the value of the VSWR is small, so that it is possible to maintain the distortion characteristics of the amplifier 16 in a predetermined range, and reduce power consumption of the base station device 10A.

DPDC and Bias Output Unit of First Embodiment

FIG. 2 is a block diagram illustrating an example of the DPDC and the bias output unit according to the first embodiment. FIG. 2 illustrates only blocks related to distortion compensation performed by the DPDC 11 and generation and output of a bias control signal performed by the bias output unit 25 among the blocks included in the base station device 10A, and other blocks are omitted. The DPDC 11 includes a central processing unit (CPU) 1, an optical module 2, a field programmable gate array (FPGA) 3, and a bias control unit 4.

The CPU 1 controls the entire DPDC 11. The optical module 2 converts a transmission signal input from an optical network (not illustrated) from an optical signal to an analog electrical signal, and then outputs the transmission signal to the FPGA 3. The FPGA 3 includes a common public radio interface (CPRI (registered trademark), the same applied to below) 3a and a digital pre distortion (DPD) 3b. The DPD 3b includes a multiplier 3b-1, an address generating unit 3b-2, a look up table (LUT) 3b-3, and a subtractor 3b-4.

The CPRI 3a is an interface that inputs, from the optical module 2, the transmission signal converted to the electrical signal, and outputs, to the DPD 3b, the transmission signal. The DPD 3b performs predistortion (distortion compensation) on the transmission signal input from the CPRI 3a. Specifically, the address generating unit 3b-2 generates an address based on a parameter (for example, signal power) of the transmission signal input from the CPRI 3a, and outputs the address to the LUT 3b-3. Furthermore, the subtractor 3b-4 outputs, to the LUT 3b-3, a signal obtained by subtracting a feedback signal flowing from the coupler 17 to the DPDC 11 from the transmission signal input from the CPRI 3a.

The LUT 3b-3 outputs a distortion compensation coefficient, which corresponds to the address generated by the address generating unit 3b-2 and the signal output from the subtractor 3b-4 and which is stored in the LUT 3b-3. Then, the multiplier 3b-1 performs distortion compensation by multiplying the transmission signal input from the CPRI 3a by the distortion compensation coefficient output from the LUT 3b-3, and outputs a transmission signal (Tx_FW) subjected to the distortion compensation to the coupler 17 (see FIG. 1).

Furthermore, the FPGA 3 updates the distortion compensation coefficient in the LUT 3b-3 at a timing of receiving a feedback signal from the coupler 17 due to periodical switching by the switch 21. Specifically, the FPGA 3 updates the distortion compensation coefficient in the LUT 3b-3 in accordance with the address generated by the address generating unit 3b-2 and the signal output from the subtractor 3b-4.

Furthermore, the FPGA 3 receives, from the coupler 20, a reflected wave from the antenna 100 (see FIG. 1) due to periodical switching by the switch 21. Then, the FPGA 3 calculates a VSWR based on the reflected wave received from the coupler 20, and notifies the bias control unit 4 of a value of the calculated VSWR.

The bias control unit 4 includes a memory 4a and a programmable logic device (PLD) 4b. The memory 4a stores therein, as will be described later, a range of the value of the VSWR and a PA-Vg (hereinafter, may be referred to as a bias value) that is a value of a bias voltage to be applied to the amplifier 16, in an associated manner. The bias value stored in the memory 4a is a value for generating a bias voltage to be applied to the carrier amplifier 16b and the peak amplifier 16d with respect to the value of the VSWR within the associated range.

The PLD 4b refers to the memory 4a and specifies a bias value based on the value of the VSWR output from the FPGA 3. Then, if the specified bias value is a value different from a bias value that has previously been output to the bias output unit 25, the PLD 4b generates a bias control signal including the specified bias value, and outputs the generated bias control signal to the bias output unit 25. Then, the PLD 4b sends a notice of change indicating a change in the bias voltage to the FPGA 3. Incidentally, if the value of the VSWR output from the FPGA 3 is the same as the bias value that has previously been output to the bias output unit 25, the PLD 4b does not send the above-described notice of change to the FPGA 3.

The bias output unit 25 includes a DA converter 25a and an operational amplifier 25b. The DA converter 25a converts the bias control signal that is a digital signal output from the PLD 4b to an analog signal. The operational amplifier 25b generates a bias voltage by amplifying the bias control signal converted to the analog signal by the DA converter 25a at a predetermined amplification factor, and applies the generated bias voltage to the carrier amplifier 16b and the peak amplifier 16d.

Incidentally, as illustrated in FIG. 2, the bias control unit 4 of the DPDC 11 and the bias output unit 25 are included in a bias unit 25A. In the first embodiment, the bias control unit 4 that controls the bias unit 25A is included in the DPDC 11. However, the disclosed technology is not limited to this example, and the bias control unit 4 and the bias output unit 25 of the bias unit 25A may be provided in a device independent of the DPDC 11.

Example of Correspondence Between VSWR and Bias Value of First Embodiment

FIG. 3A is a diagram illustrating an example of correspondence between the VSWR and the bias value according to the first embodiment. For example, FIG. 3A illustrates an example of a bias value for each range of the VSWR, which is applied when the carrier amplifier 16b and the peak amplifier 16d are normally-on field effect transistors (FETs), such as GaN-HEMTs. In the case of the normally-on FETs, such as the GaN-HEMTs, a bias voltage applied to the carrier amplifier 16b and the peak amplifier 16d is a negative voltage. GaN-HEMT is an abbreviation for a gallium nitride-high electron mobility transistor.

For example, as illustrated in FIG. 3A, if the "VSWR" is a value in a range of "1.0 to 1.1", a bias voltage value "PA-Vg" applied to the carrier amplifier 16b and the peak amplifier 16d is "−3.5 V". As illustrated in FIG. 3A, the "PA-Vg" indicating "−3.5 V" is stored in a "memory address" of "SAVE1" in the memory 4a (see FIG. 2). Specifically, if the "VSWR" is a value in the range of "1.0 to 1.1" for example, the PLD 4b can acquire "−3.5 V" as the "PA-Vg" by referring to the "memory address" of "SAVE1" in the memory 4a.

FIG. 3B is a diagram illustrating another example of correspondence between the VSWR and the bias value according to the first embodiment. For example, FIG. 3B illustrates an example of a bias value for each range of the VSWR, which is applied when the carrier amplifier 16b and the peak amplifier 16d are normally-off FETs, such as LDMOSs. In the case of the normally-off FETs, such as the LDMOSs, a bias voltage applied to the carrier amplifier 16b and the peak amplifier 16d is a positive voltage. LDMOS is an abbreviation for a laterally diffused metal oxide semiconductor.

For example, as illustrated in FIG. 3B, if the "VSWR" is a value in a range of "1.0 to 1.1", a bias voltage value "PA-Vg" applied to the carrier amplifier 16b and the peak amplifier 16d is "0.5 V". As illustrated in FIG. 3B, the "PA-Vg" indicating "0.5 V" is stored in a "memory address" of "SAVE1" in the memory 4a (see FIG. 2). Specifically, if the "VSWR" is a value in the range of "1.0 to 1.1" for example, the PLD 4b can acquire "0.5 V" as the "PA-Vg" by referring to the "memory address" of "SAVE1" in the memory 4a. Meanwhile, in FIG. 3A and FIG. 3B, for example, "1.0 to 1.1" described in the field of the "VSWR" indicates that the range of the value of the VSWR is equal to or greater than 1.0 and smaller than 1.1.

The DPDC 11 stores correspondence between the VSWR and the bias value as illustrated in FIG. 3A or FIG. 3B in the memory 4a or the like in advance for the individual amplifier 16, so that it is possible to read and use an appropriate bias value at the time of operation.

Bias Control Process of First Embodiment

Figure 4:
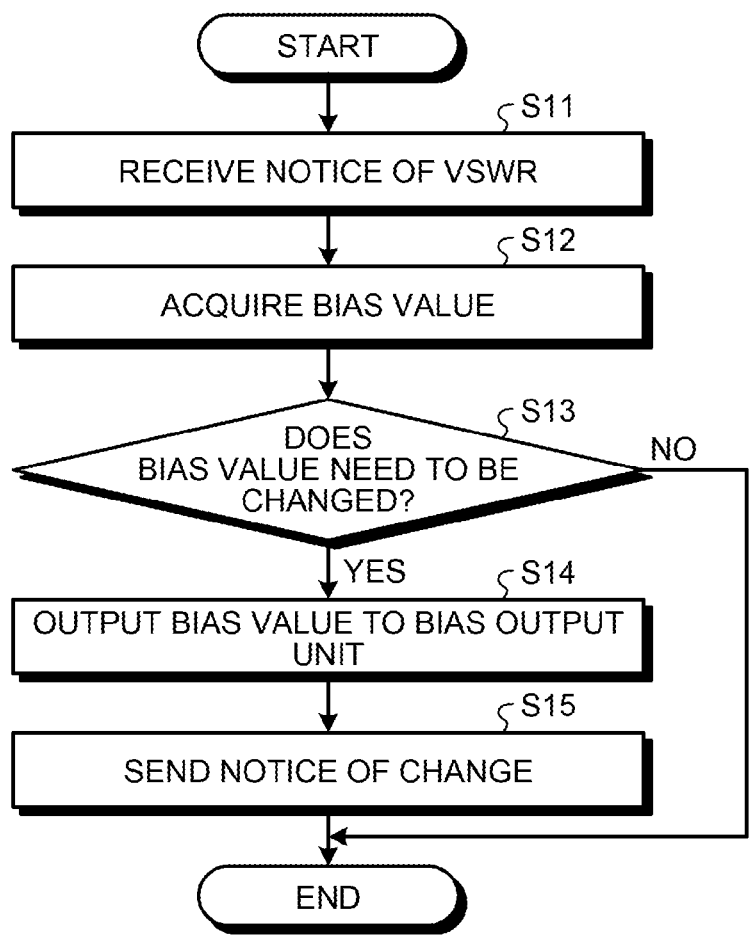
FIG. 4 is a flowchart illustrating an example of a bias control process according to the first embodiment.

FIG. 4 is a flowchart illustrating an example of a bias control process according to the first embodiment. For example, the bias control process according to the first embodiment is performed by the PLD 4b (see FIG. 2) every time the VSWR is provided by the FPGA 3 (see FIG. 2). However, the bias control process may be performed periodically in a predetermined cycle.

First, the PLD 4b receives a notice of a VSWR calculated by the FPGA 3 (Step S11). Subsequently, the PLD 4b refers to the memory 4a and specifies a range of the VSWR including the value of the VSWR provided by the FPGA 3. Then, the PLD 4b refers to the memory 4a and acquires a bias value from a memory address associated with the specified range of the VSWR (Step S12).

Subsequently, the PLD 4b refers to the memory 4a and specifies a bias value that has previously been output to the bias output unit 25. Then, the PLD 4b determines whether the bias value currently acquired from the memory 4a and the bias value that has previously been output to the bias output unit 25 are different values, and determines whether the bias value needs to be changed (Step S13). If the bias value need not be changed (NO at Step S13), that is, if the bias value currently acquired from the memory 4a and the bias value that has previously been output to the bias value are the same value, the PLD 4b ends the bias control process.

In contrast, if the bias value needs to be changed (YES at Step S13), the PLD 4b outputs a bias control signal indicating the bias value acquired from the memory 4a to the bias output unit 25 (Step S14). The bias output unit 25 converts the bias control signal that is a digital signal output from the PLD 4b into a bias voltage that is an analog signal. Then, the bias output unit 25 generates a bias voltage by amplifying the bias control signal converted to the analog signal at a predetermined amplification factor, and applies the generated bias voltage to the carrier amplifier 16b and the peak amplifier 16d.

Subsequently, the PLD 4b writes, in the memory 4a, the bias value indicated by the bias control signal output to the bias output unit 25. Then, the PLD 4b notifies the FPGA 3 that the bias voltage on the carrier amplifier 16b and the peak amplifier 16d is changed (Step S15). The FPGA 3 updates the LUT 3b-3 in a predetermined cycle, and upon receiving a notice of change in the bias voltage from the PLD 4b, updates the LUT 3b-3 based on the new bias voltage at a next update timing after reception of the notice of change. Upon completion of the process at Step S15, the PLD 4b ends the bias control process.

Timing Chart of Bias Control Process of First Embodiment

Figure 5:
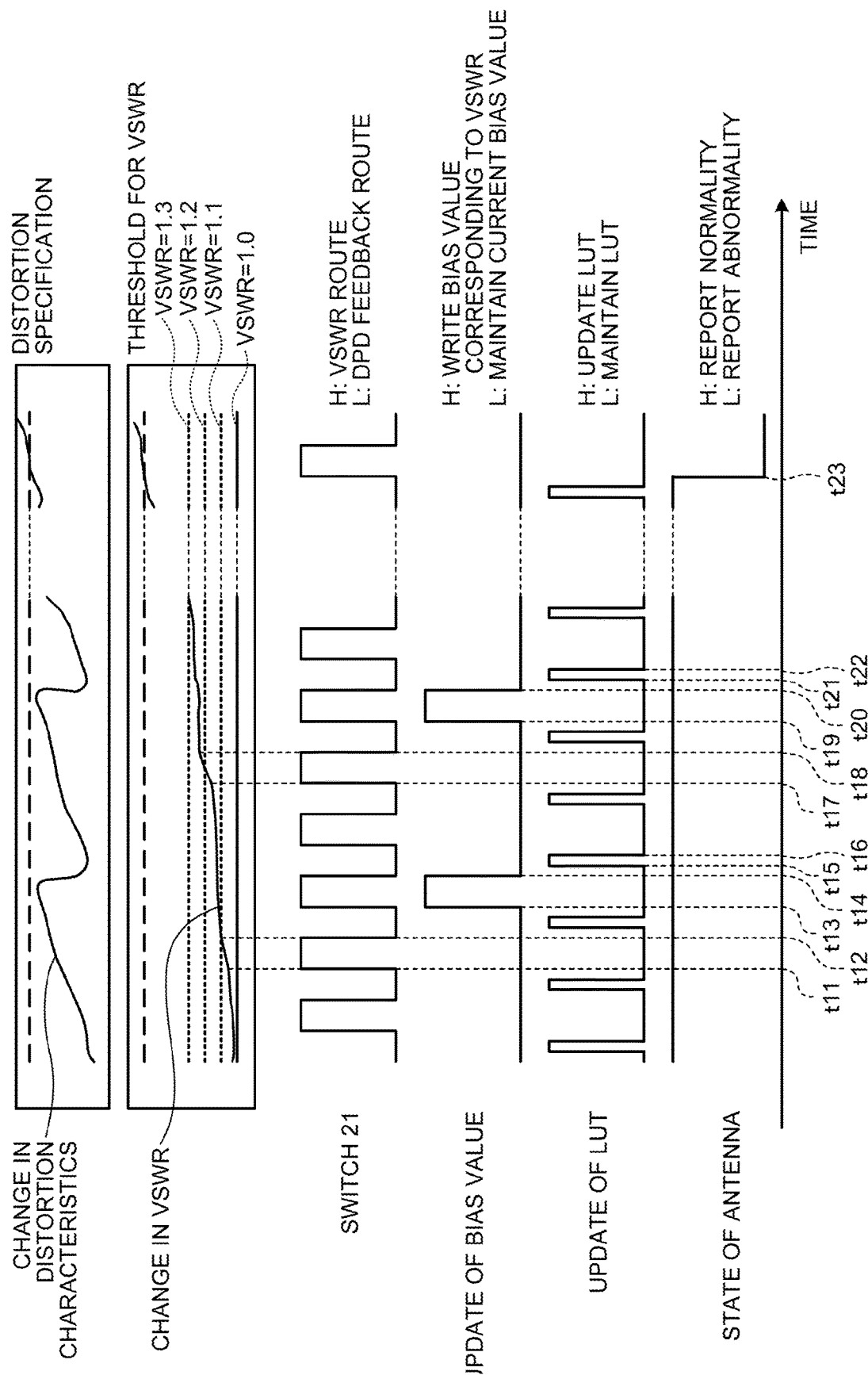
FIG. 5 is a timing chart illustrating an example of the bias control process according to the first embodiment.

FIG. 5 is a timing chart illustrating an example of the bias control process according to the first embodiment. As illustrated in FIG. 5, at a time t11, the switch 21 (see FIG. 1) changes input to the DPDC 11 (see FIG. 1) from input of a feedback signal from the coupler 17 to input of a reflected wave from the coupler 20. Then, in a period from the time t11 to a time t12, the DPDC 11 detects that the VSWR has changed from a value in a range of "1.0 to 1.1" to a value in a range of "1.1 to 1.2".

Then, in a period from a time t13 to time t14, the DPDC 11 acquires a bias value associated with the new range of the VSWR from the memory 4a, and outputs a bias control signal indicating the acquired bias value to the bias output unit 25. The bias output unit 25 applies a bias voltage corresponding to the bias control signal to the carrier amplifier 16b and the peak amplifier 16d. Then, the DPDC 11 updates the LUT 3b-3 in a period from a time t15 to a time t16, which is a timing of the first periodic cycle after the time t14.

Furthermore, at a time t17, the switch 21 changes input to the DPDC 11 from input of a feedback signal from the coupler 17 to input of a reflected wave from the coupler 20. Then, in a period from the time t17 to a time t18, the DPDC 11 detects that the VSWR has changed from a value in the range of "1.1 to 1.2" to a value in a range of "1.2 to 1.3".

Then, in a period from a time t19 to time t20, the DPDC 11 acquires a bias value associated with the new range of the VSWR from the memory 4a, and outputs a bias control signal indicating the acquired bias value to the bias output unit 25. The bias output unit 25 applies a bias voltage corresponding to the bias control signal to the carrier amplifier 16b and the peak amplifier 16d. Then, the DPDC 11 updates the LUT 3b-3 in a period from a time t21 to a time t22, which is a timing of the first periodic update cycle after the time t20.

Incidentally, after a time t23, a distortion specification exceeds a threshold and the state of the antenna becomes abnormal, so that the DPDC 11 does not update the bias value based on the value of the VSWR. In a period before the state of the antenna becomes abnormal, the DPDC 11 performs the processes indicated at the times t11 to t22 in a predetermined cycle.

Effect of First Embodiment

Figure 6:
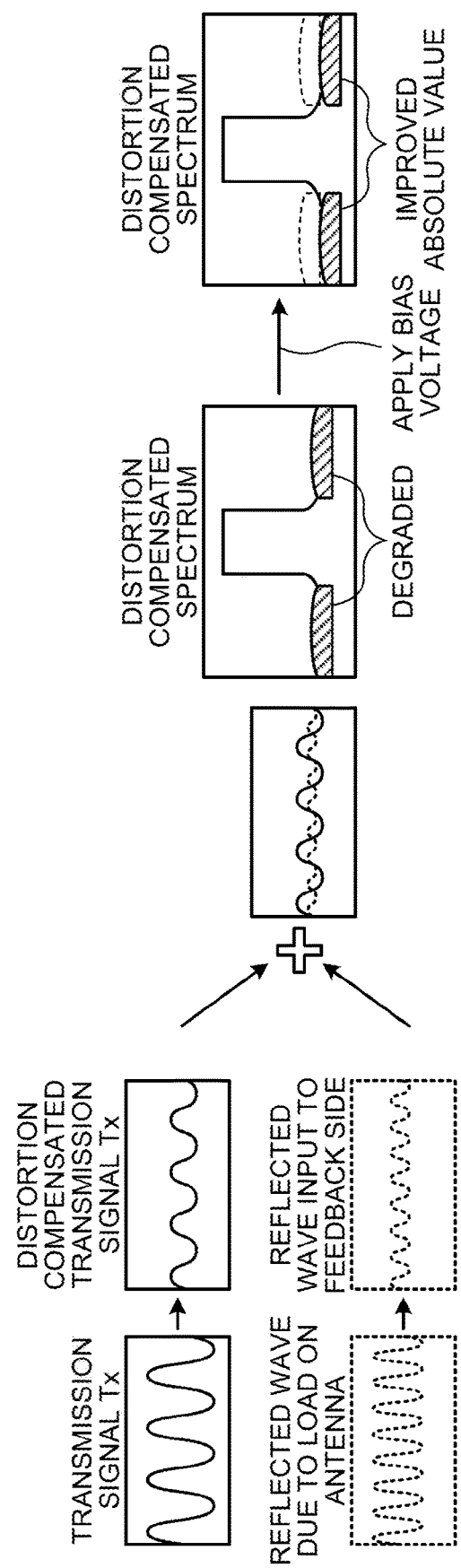
FIG. 6 is a diagram for explaining an effect of the first embodiment.

FIG. 6 is a diagram for explaining an effect of the first embodiment. For example, if the characteristics of the antenna 100 is changed, as illustrated in FIG. 6, the DPDC 11 performs distortion compensation based on a feedback signal, in which a transmission signal output from the amplifier 16 and a reflected wave from the antenna 100 are superimposed. Therefore, a noise corresponding to the magnitude of the reflected wave is mixed into the transmission signal. To cope with this, the DPDC 11 of the first embodiment controls a bias voltage of the amplifier 16 in accordance with the magnitude of the VSWR in order to improve the linearity of the amplifier 16. Therefore, the DPDC 11 of the first embodiment prevents a divergence between the transmission signal and the feedback signal output by the amplifier 16, and, as illustrated in FIG. 6 for example, can reduce distortion remaining in the transmission signal subjected to the distortion compensation. Consequently, the base station device 10A of the first embodiment can maintain the high quality of the transmission signal transmitted from the antenna 100 even when the characteristics of the antenna 100 is changed.

In general, in an amplifier mounted on the base station device, there is a trade-off relationship between power consumption (efficiency) and distortion characteristics, and the amplifier is set so as to operate by focusing attention on low power consumption (high efficiency) under the conditions of requirement specification of the distortion characteristics. However, in the first embodiment, if distortion gets worse due to the influence of a reflected wave from the antenna side, priority is given to the improvement of the distortion characteristics relative to the efficiency. Therefore, in the first embodiment, it becomes possible to maintain the distortion characteristics of the transmission signal in a state within the range of the requirement specification, with respect to a change in the load at the time of operation of the base station device.

Furthermore, in the first embodiment, a reduction in the quality of the transmission signal due to a change in the characteristics of the antenna is prevented by using the switch 21 that switches between the feedback signal and the reflected wave and selectively inputs one of the signals to the DPDC11 and by using the bias unit 25A. Therefore, in the first embodiment, it is possible to prevent an increase in the cost for hardware and processes without increasing the size of a circuit, and maintain the distortion characteristics of the transmission signal in a state within the range of the requirement specification.

[b] Second Embodiment

Base Station Device of Second Embodiment

Figure 7:
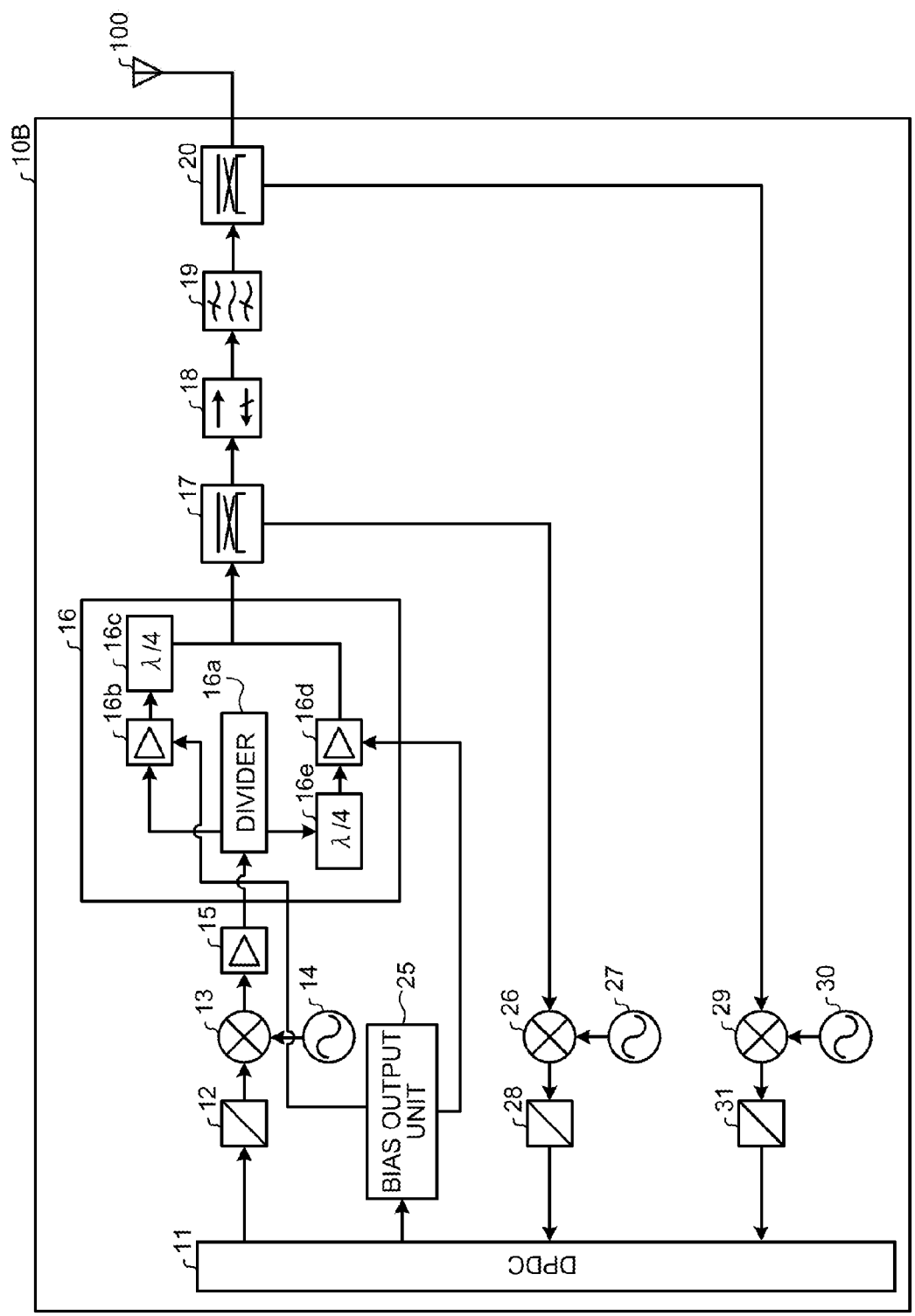
FIG. 7 is a block diagram illustrating an example of a base station device according to a second embodiment.

A second embodiment is different from the first embodiment in that a route of the feedback signal and a route of the reflected wave from the antenna are separated from each other, and the feedback signal and the reflected wave are always input to the DPDC 11. With this configuration, it is possible to adjust a bias voltage of the amplifier based on a VSWR in real time. In the description of the second embodiment, a difference from the first embodiment will be explained. FIG. 7 is a block diagram illustrating an example of a base station device according to the second embodiment.

As illustrated in FIG. 7, a base station device 10B of the second embodiment is different from the base station device 10A of the first embodiment (see FIG. 1) as described below. Specifically, the base station device 10B includes mixers 26 and 29, PLLs 27 and 30, and AD converters 28 and 31, instead of the switch 21, the mixer 22, the PLL 23, and the AD converter 24.

In the base station device 10B, a feedback signal from the coupler 17 is input to the mixer 26. The mixer 26 performs down-conversion on the feedback signal from the coupler 17 into a baseband signal by using a local oscillation signal output by the PLL 27, and outputs the signal subjected to the down-conversion to the AD converter 28. The AD converter 28 converts the signal output from the mixer 26 from an analog signal to a digital signal, and then the outputs the signal to the DPDC 11.

Furthermore, in the base station device 10B, a reflected wave from the coupler 20 is input to the mixer 29. The mixer 29 performs down-conversion on the reflected wave from the coupler 20 into a baseband signal by using a local oscillation signal output by the PLL 30, and outputs the signal subjected to the down-conversion to the AD converter 31. The AD converter 31 converts the signal output from the mixer 29 from an analog signal to a digital signal, and then outputs the signal to the DPDC 11.

The DPDC 11 performs distortion compensation on the transmission signal based on the feedback signal output from the coupler 17. Furthermore, the DPDC 11 detects a reflected wave from the antenna 100, and monitors a VSWR based on the reflected wave. Then, the bias output unit 25 applies a bias voltage corresponding to the VSWR based on the reflected wave to the carrier amplifier 16b and the peak amplifier 16d (see FIG. 1) under the control of the DPDC 11, to thereby change the amplification characteristics of the amplifiers.

Timing Chart of Bias Control Process of Second Embodiment

Figure 8:
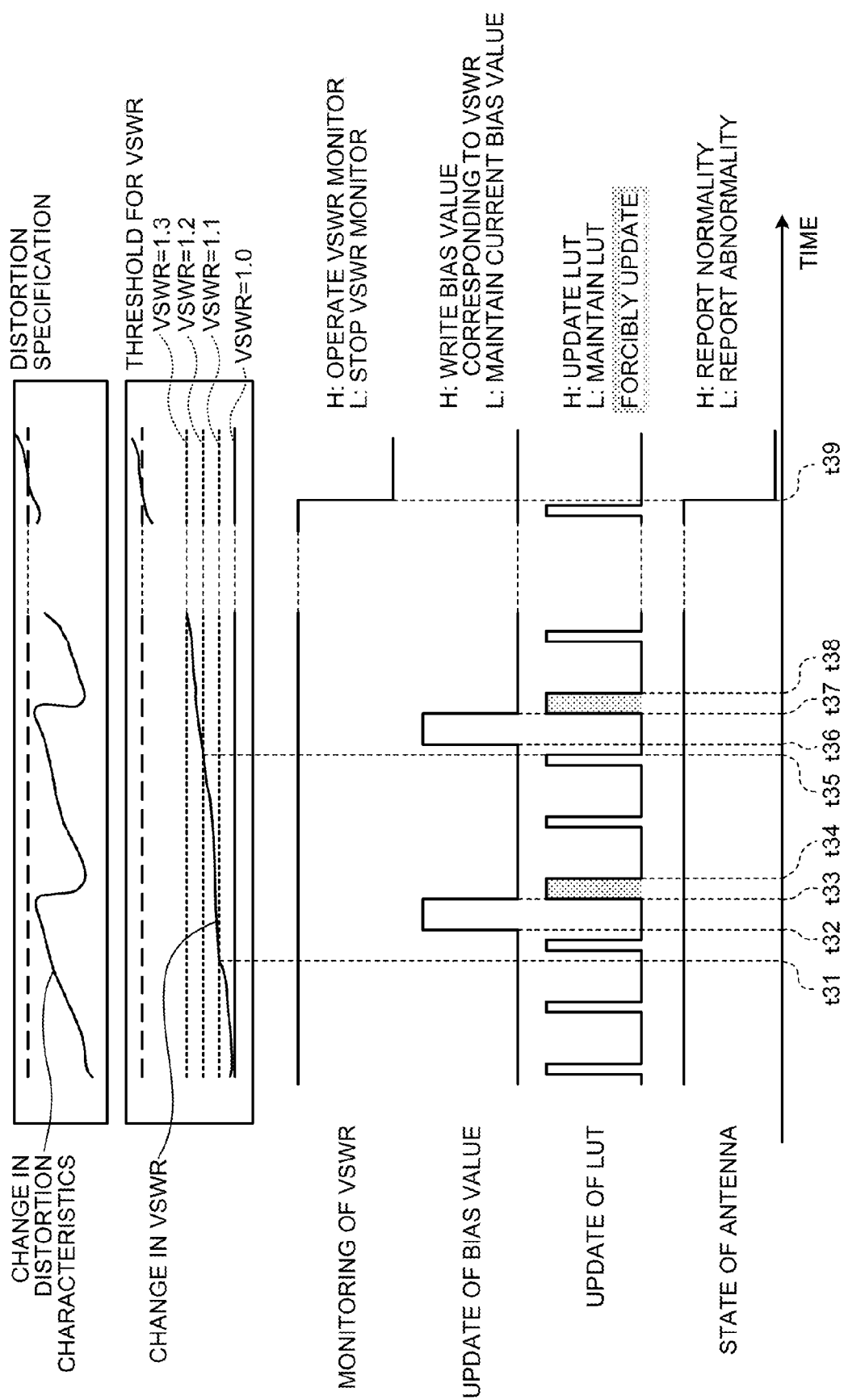
FIG. 8 is a timing chart illustrating an example of a bias control process according to the second embodiment.

FIG. 8 is a timing chart illustrating an example of a bias control process according to the second embodiment. As illustrated in FIG. 8, the DPDC 11 performs the following processes at times other than a time at which a distortion specification exceeds a threshold and the state of the antenna becomes abnormal as at a time after a time t39.

Specifically, the DPDC 11 always monitors the VSWR based on the reflected wave at times before the time t39. Then, at a time t31, the DPDC 11 detects that the VSWR has changed from a value in a range of "1.0 to 1.1" to a value in a range of "1.1 to 1.2".

Then, in a period from a time t32 to a time t33, the DPDC 11 acquires a bias value associated with the new range of the VSWR from the memory 4a (see FIG. 2), and outputs a bias control signal indicating the acquired bias value to the bias output unit 25. The bias output unit 25 applies a bias voltage corresponding to the bias control signal to the carrier amplifier 16b and the peak amplifier 16d (see FIG. 1). Then, the DPDC 11 receives a notice of change in the bias value from the PLD 4b at the time t33, and forcibly updates the LUT 3b-3 in a period from the time t33 to a time t34 even at a timing other than the timing of a periodic update cycle.

Furthermore, at a time t35, the DPDC 11 detects that the VSWR has changed form a value in the range of "1.1 to 1.2" to a value in a range of "1.2 to 1.3".

Then, in a period from a time t36 to a time t37, the DPDC 11 acquires a bias value associated with the new range of the VSWR from the memory 4a, and outputs a bias control signal indicating the acquired bias value to the bias output unit 25. The bias output unit 25 applies a bias voltage corresponding to the bias control signal to the carrier amplifier 16b and the peak amplifier 16d. Then, the DPDC 11 receives a notice of change in the bias value from the PLD 4b at a time t37, and forcibly updates the LUT 3b-3 in a period from the time t37 to a time t38 even at a timing other than the timing of a periodic update cycle.

Then, after the time t39, the distortion specification exceeds the threshold and the state of the antenna becomes abnormal, the DPDC 11 does not update the bias value based on the value of the VSWR. In a period before the state of the antenna becomes abnormal, the DPDC 11 performs the processes indicated at the times t31 to t38 every time the DPDC 11 detects a change in the bias value corresponding to the VSWR.

Effect of Second Embodiment

In the second embodiment, a route of a feedback signal from the output end of the amplifier 16 and a route of a reflected wave from the antenna 100 are separated from each other. Furthermore, in the second embodiment, the feedback signal and the reflected wave are input to the DPDC 11 without being switched from each other, and the bias voltage on the carrier amplifier 16b and the peak amplifier 16d of the amplifier 16 is changed based on the VSWR that is measured in real time. Therefore, the second embodiment can follow a reduction in the VSWR in real time, can immediately update the LUT 3b-3 the DPDC 11 when the bias value is updated, and can prevent a reduction in the quality of the transmission signal of the base station device 10B in real time.

[c] Third Embodiment

Base station device of third embodiment

Figure 9:
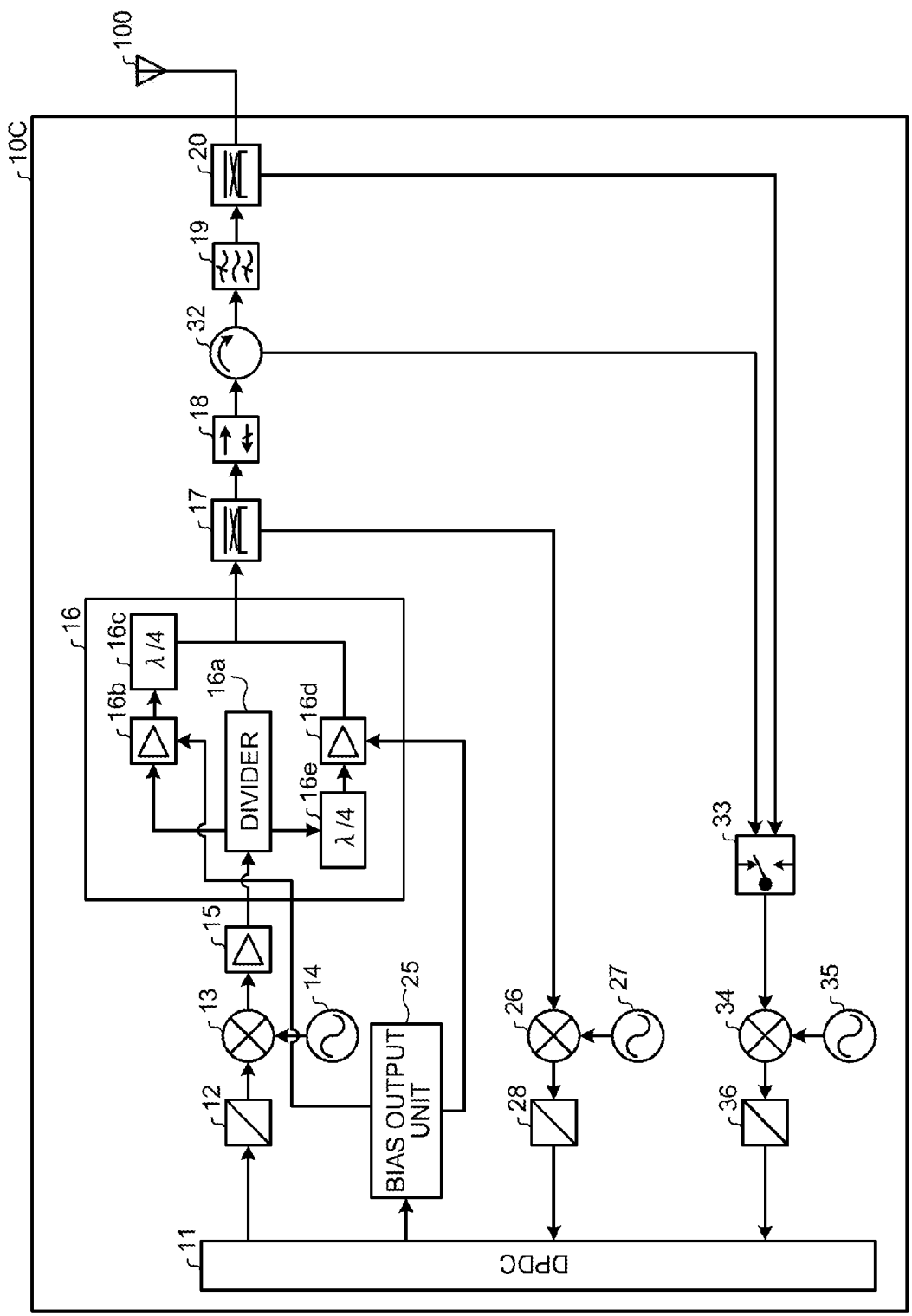
FIG. 9 is a block diagram illustrating an example of a base station device according to a third embodiment.

A third embodiment is an example in which time division duplex (TDD) is applied to a base station device. The third embodiment is different from the second embodiment in that a circulator is connected between the isolator 18 and the filter 19 in the base station device. Furthermore, the third embodiment is different from the second embodiment in that a switch switches between a received signal (uplink signal), which is obtained from the antenna 100 and output from the circulator, and a reflected wave, which is output from the coupler 20, and one of the signals is input to the DPDC 11. In the description of the third embodiment, a difference from the second embodiment will be explained. FIG. 9 is a block diagram illustrating an example of a base station device according to the third embodiment.

As illustrated in FIG. 9, a base station device 10C of the third embodiment is different from the base station device 10B of the second embodiment (see FIG. 7) in that a circulator 32 is connected between the isolator 18 and the filter 19. Furthermore, the base station device 10C of the third embodiment is different from the base station device 10B of the second embodiment in that it includes a switch 33, a mixer 34, a PLL 35, and an AD converter 36, instead of the mixer 29, the PLL 30, and the AD converter 31.

In the base station device 10C, a feedback signal output from the coupler 17 is input to the mixer 26. The mixer 26 performs down-conversion on the feedback signal output from the coupler 17 into a baseband signal by using a local oscillation signal output by the PLL 27, and outputs the signal subjected to the down-conversion to the AD converter 28. The AD converter 28 converts the signal output from the mixer 26 from an analog signal to a digital signal, and then outputs the signal to the DPDC 11.

Furthermore, in the base station device 10C, the circulator 32 outputs a transmission signal output from the isolator 18 to the filter 19. Moreover, the circulator 32 outputs a received signal obtained through the antenna 100, the coupler 20, and the filter 19 to the switch 33. The coupler 20 splits the transmission signal, outputs a split signal from the antenna 100, and outputs a reflected wave from the antenna 100 to the switch 33.

The switch 33 is an RF switch. The switch 33 selects a signal output from the circulator 32 and a signal output from the coupler 20 in a predetermined cycle, and outputs the selected signal to the mixer 34. Incidentally, the switch 33 outputs the signal output from the circulator 32 to the mixer 34 at a reception timing in TDD, and outputs the reflected wave output from the coupler 20 to the mixer 34 at a transmission timing in TDD.

The mixer 34 performs down-conversion on the signal output from the circulator 32 or the coupler 20 into a baseband signal by using a local oscillation signal output by the PLL 35, and outputs the signal subjected to the down-conversion to the AD converter 36. The AD converter 36 converts the signal output from the mixer 34 from an analog signal to a digital signal, and then outputs the signal to the DPDC 11.

The DPDC 11 performs a predetermined reception process when the received signal output from the circulator 32 is input to the DPDC 11 due to periodical switching by the switch 33.

Furthermore, if an input signal from the coupler 20 is input to the DPDC 11 due to periodical switching by the switch 33, the DPDC 11 detects a reflected wave from the antenna 100 and monitors a VSWR based on the reflected wave. Then, the bias output unit 25 applies a bias voltage corresponding to the VSWR based on the reflected wave to the carrier amplifier 16b and the peak amplifier 16d (see FIG. 1) under the control of the DPDC 11, to thereby change the amplification characteristics of the amplifiers.

Timing Chart of Bias Control Process of Third Embodiment

Figure 10:
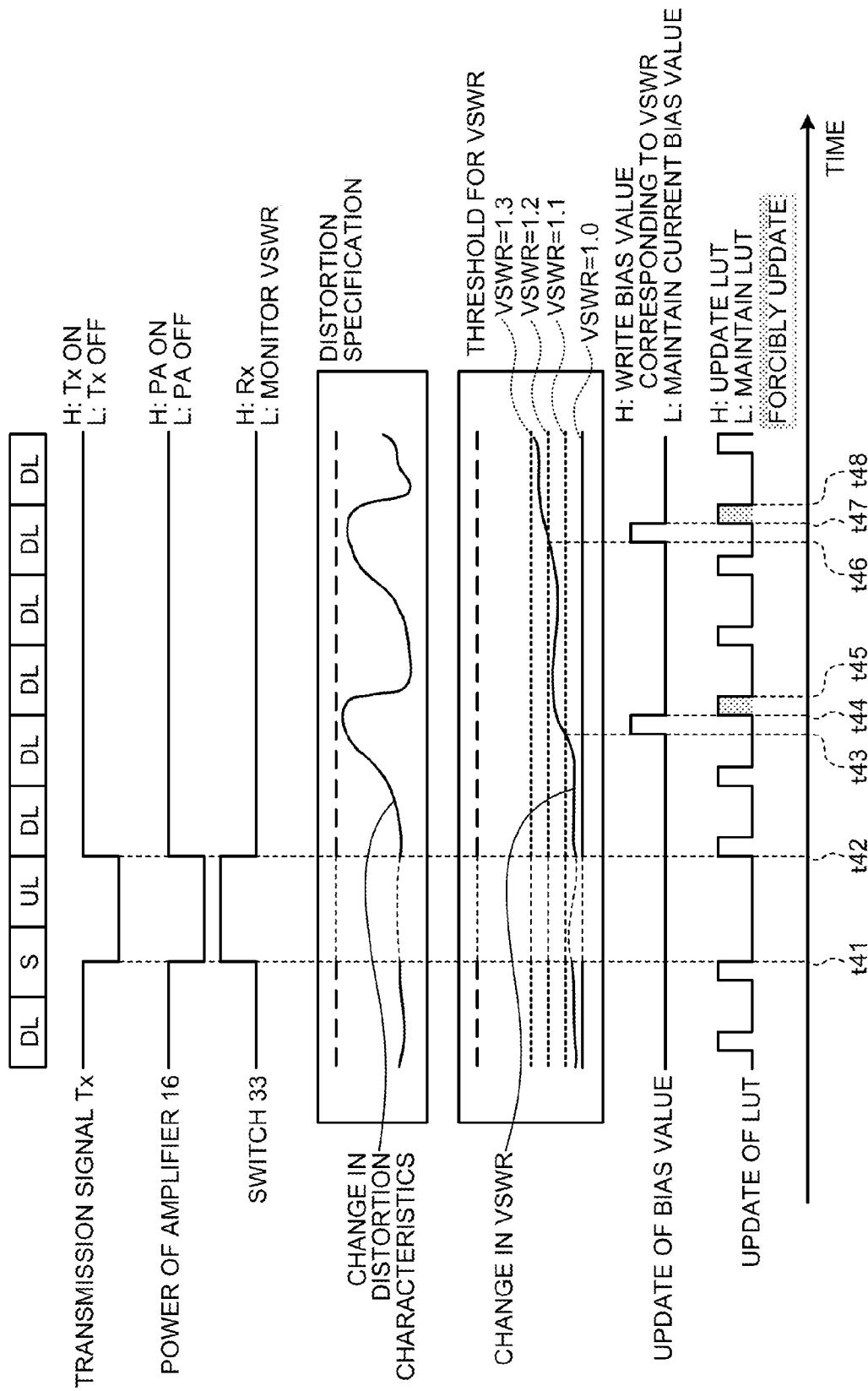
FIG. 10 is a timing chart illustrating an example of a bias control process according to the third embodiment.

FIG. 10 is a timing chart illustrating an example of a bias control process according to the third embodiment. As illustrated in FIG. 10, the base station device 10C sets output of a transmission signal to OFF from a time t41, at which an S frame (Special Sub Frame) indicating a start of reception of a UL (uplink or uplink communication) frame, to a time t42, at which reception of the UL frame is completed. Furthermore, the base station device 10C turns off the power of the amplifier 16 from the time t41 to the time t42. Moreover, the switch 33 outputs, to the DPDC 11, a signal output from the circulator 32 from the time t41 to the time t42. That is, from the time t41 to the time t42, the DPDC 11 suspends monitoring of a VSWR based on a reflected wave. Therefore, the DPDC 11 does not update a bias value from the time t41 to the time t42. Furthermore, the DPDC 11 does not update the LUT 3b-3 from the time t41 to the time t42 regardless of the update cycle.

Upon completion of reception of the UL frame at the time t42, the base station device 10C sets the output of the transmission signal to ON. Furthermore, upon completion of reception of the UL frame at the time t42, the base station device 10C turns on the power of the amplifier 16. Moreover, upon completion of reception of the UL frame at the time t42, the switch 33 outputs, to the DPDC 11, a signal output from the coupler 20. Consequently, the DPDC 11 resumes monitoring of the VSWR based on the reflected wave. Furthermore, upon completion of reception of the UL frame at the time t42, the DPDC 11 starts to update the LUT 3b-3 in a predetermined update cycle.

Then, at a time t43, the DPDC 11 detects that the VSWR has changed from a value in a range of "1.0 to 1.1" to a value in a range of "1.1 to 1.2".

Then, in a period from the time t43 to a time t44, the DPDC 11 acquires a bias value associated with the new range of the VSWR from the memory 4a (see FIG. 2), and outputs a bias control signal indicating the acquired bias value to the bias output unit 25. The bias output unit 25 applies a bias voltage corresponding to the bias control signal to the carrier amplifier 16b and the peak amplifier 16d (see FIG. 1). Then, the DPDC 11 receives a notice of change in the bias value from the PLD 4b at the time t44, and forcibly updates the LUT 3b-3 in a period from the time t44 to a time t45 even at a timing other than the timing of a periodic update cycle.

Then, at a time t46, the DPDC 11 detects that the VSWR has changed from a value in the range of "1.1 to 1.2" to a value in a range of "1.2 to 1.3".

Furthermore, in a period from the time t46 to a time t47, the DPDC 11 acquires a bias value associated with the new range of the VSWR from the memory 4a, and outputs a bias control signal indicating the acquired bias value to the bias output unit 25. The bias output unit 25 applies a bias voltage corresponding to the bias control signal to the carrier amplifier 16b and the peak amplifier 16d. Then, the DPDC 11 receives a notice of change in the bias value from the PLD 4b at the time t47, and forcibly updates the LUT 3b-3 in a period from the time t47 to a time t48 even at a timing other than the timing of a periodic update cycle.

Even after the time t48, the DPDC 11 performs the processes in the period from the time t41 to the time t42 every time a received signal is detected. Furthermore, even after the time t48, the DPDC 11 performs the processes in the period from the time t43 to the time t48 every time a change in the bias value corresponding to the VSWR is detected.

Effect of Third Embodiment

In the third embodiment, even the base station device 10C to which TDD is applied performs distortion compensation based on a feedback signal, switches between a received signal and a reflected wave, and monitors a VSWR based on the reflected wave. Therefore, in the third embodiment, even the base station device 10C to which TDD is applied can reduce distortion remaining in the transmission signal subjected to the distortion compensation, similarly to the first embodiment. Consequently, the base station device 10C of the third embodiment can maintain the high quality of the transmission signal transmitted from the antenna 100 even when the characteristics of the antenna 100 is changed. Furthermore, the base station device 10C of the third embodiment always monitors the feedback signal, so that it is possible to update the bias value based on the VSWR that is measured in real time. Consequently, the base station device 10C of the third embodiment can immediately update the LUT 3b-3 in accordance with a timing of updating the bias value, so that it is possible to promptly cope with the LUT 3b-3 with respect to degradation of the VSWR.

[d] Fourth Embodiment

Base Station Device of Fourth Embodiment

A fourth embodiment is an example in which TDD is applied to a base station device, similarly to the third embodiment. Furthermore, the fourth embodiment is different from the third embodiment in that, in the base station device, a first switch switches between output from the circulator 32 and output from the coupler 20, and a second switch switches between output from the first switch and output from the coupler 17 and inputs the selected output to the DPDC 11. In the description of the fourth embodiment, a difference from the third embodiment will be explained.

Figure 11:
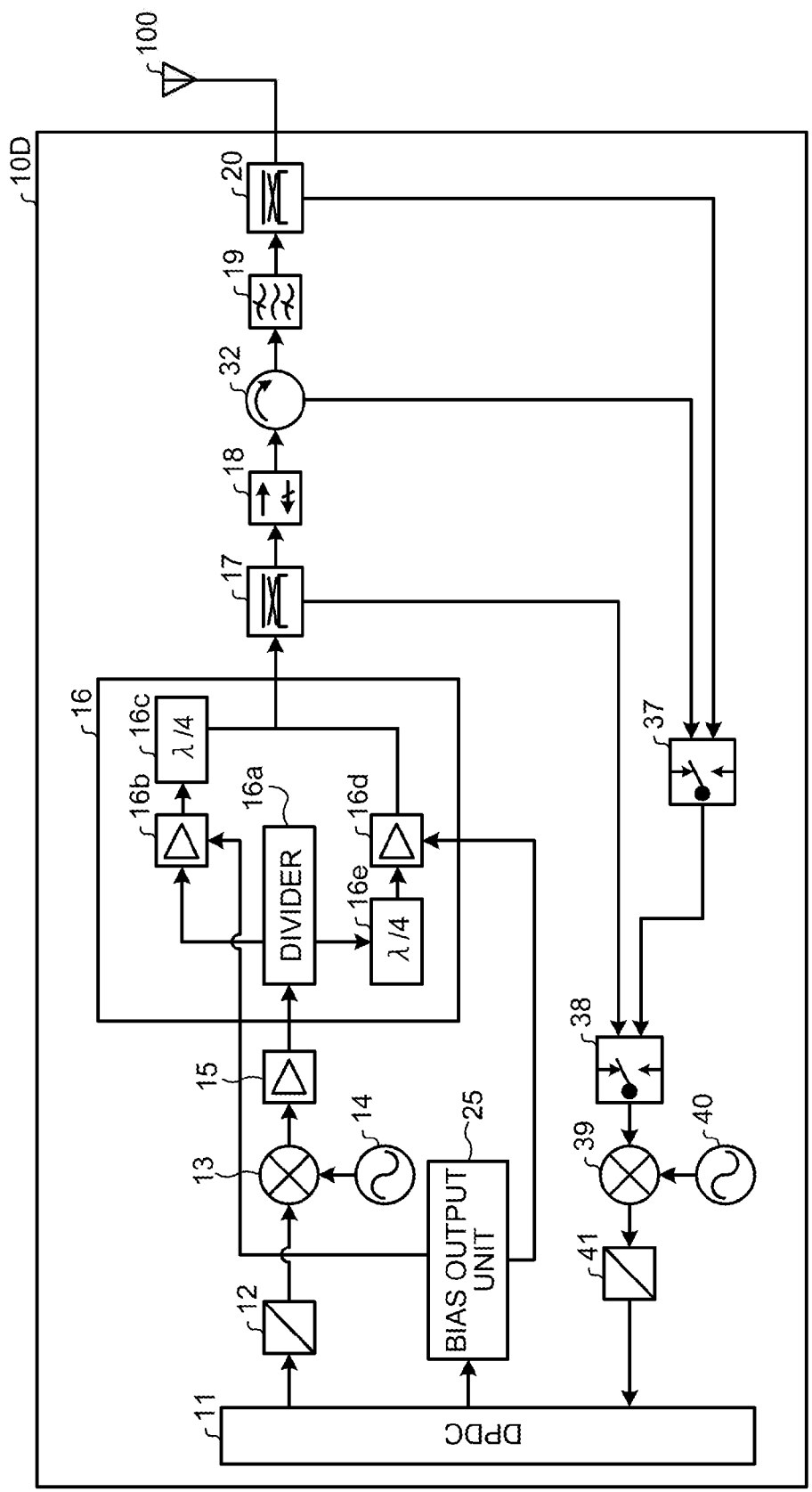
FIG. 11 is a block diagram illustrating an example of a base station device according to a fourth embodiment.

FIG. 11 is a block diagram illustrating an example of a base station device according to the fourth embodiment.

As illustrated in FIG. 11, a base station device 10D of the fourth embodiment is different from the base station device 10C of the third embodiment (see FIG. 9) as described below. Specifically, the base station device 10D includes switches 37 and 38, a mixer 39, a PLL 40, and an AD converter 41, instead of the mixers 26 and 34, the PLLs 27 and 35, the AD converters 28 and 36, and the switch 33. The switches 37 and 38 are RF switches.

In the base station device 10D, a feedback signal output from the coupler 17 is input to the mixer 39 when the feedback signal is selected by switching by the switch 38. Furthermore, in the base station device 10D, a received signal output from the circulator 32 is input to the mixer 39 when the received signal is selected by switching by the switches 37 and 38. Moreover, in the base station device 10D, a reflected wave output from the coupler 20 is input to the mixer 39 when the reflected wave is selected by switching by the switches 37 and 38.

The mixer 39 performs down-conversion on the signal output from the switch 38 to a baseband signal by using a local oscillation signal output by the PLL 40, and outputs the signal subjected to the down-conversion to the AD converter 41. The AD converter 41 converts the signal output from the mixer 39 from an analog signal to a digital signal, and then outputs the signal to the DPDC 11.

That is, in the base station device 10D, one of the feedback signal, the reflected wave, and the received signal is selectively input to the DPDC 11, and two or more of them are not simultaneously input to the DPDC 11.

Timing Chart of Bias Control Process of Fourth Embodiment

Figure 12:
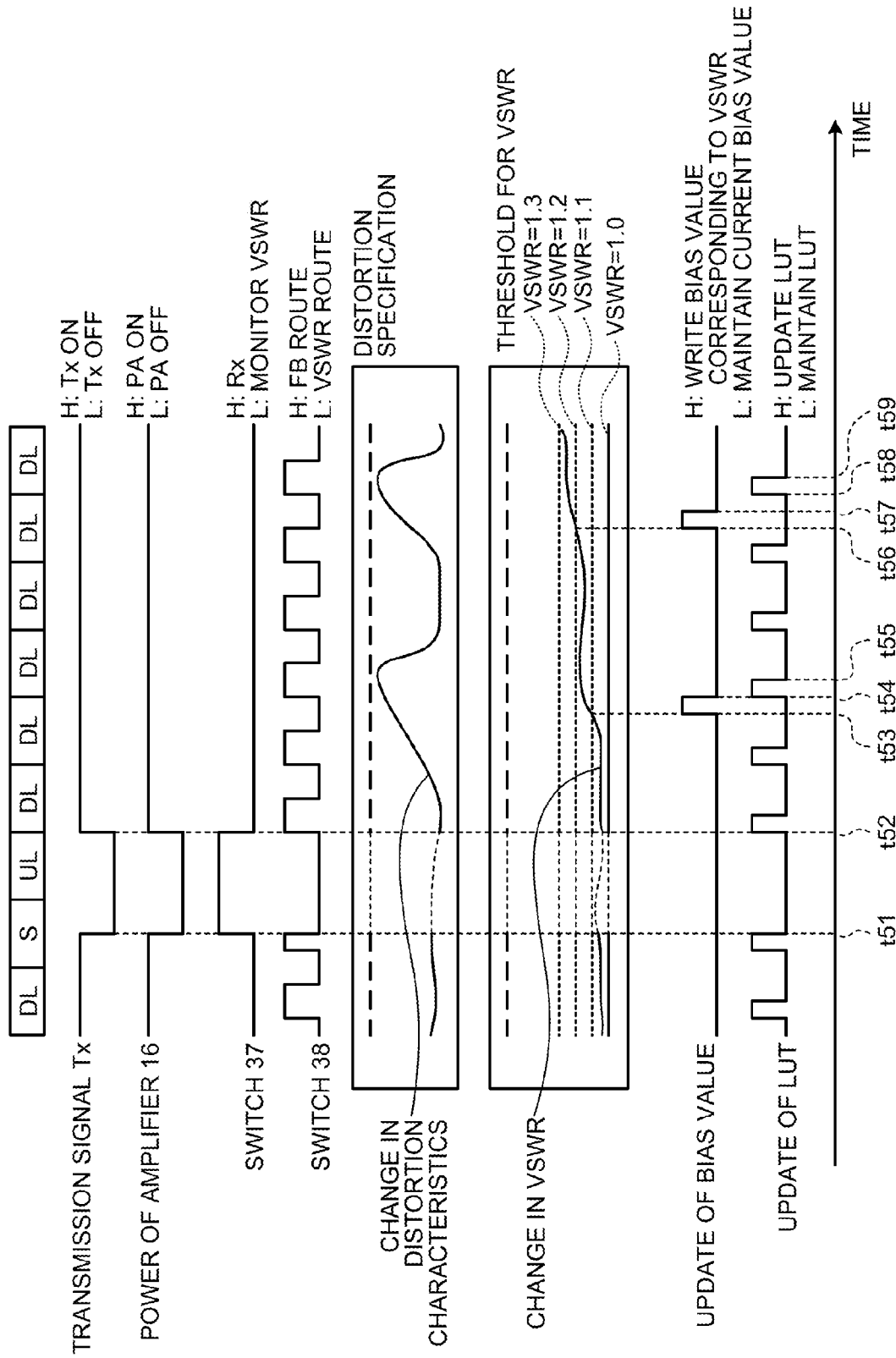
FIG. 12 is a timing chart illustrating an example of a bias control process according to the fourth embodiment.
Figure 13A:
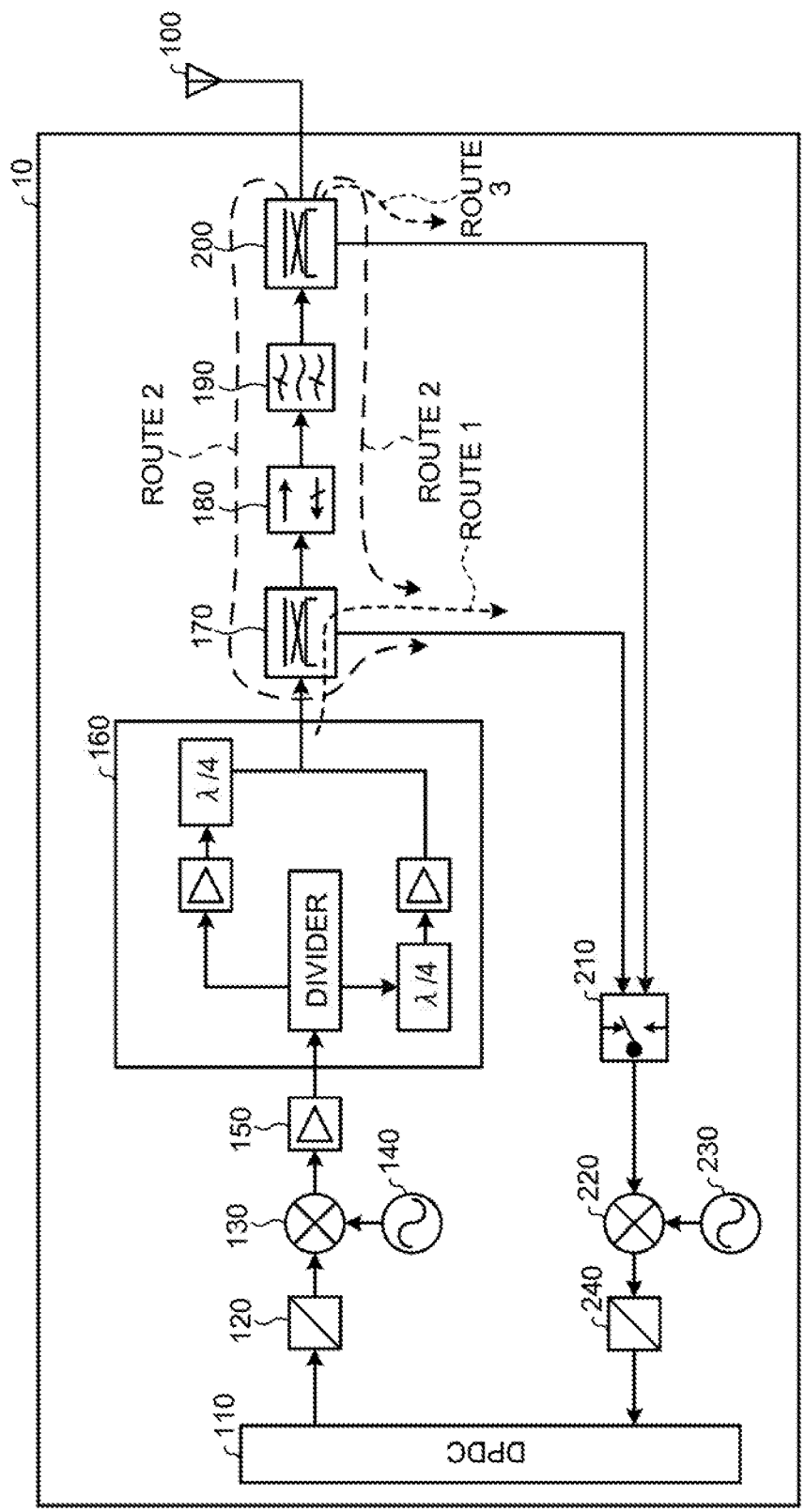
FIG. 13A is a block diagram illustrating an example of a base station device according to a conventional technology.

FIG. 12 is a timing chart illustrating an example of a bias control process according to the fourth embodiment. As illustrated in FIG. 12, the base station device 10D sets output of a transmission signal to OFF from a time t51, at which an S frame indicating a start of reception of a UL frame, to a time t52, at which reception of the UL frame is completed. Furthermore, the base station device 10D turns off the power of the amplifier 16 in a period from the time t51 to the time t52. Moreover, the switch 37 inputs a signal output from the circulator 32 to the DPDC 11 in the period from the time t51 to the time t52. Incidentally, in the period from the time t51 to the time t52, the switch 38 outputs a signal output from the switch 37 to the mixer 39, but a reflected wave from the coupler 20 is blocked by the switch 37 and is not input to the DPDC 11. That is, in the period from the time t51 to the time t52, the DPDC 11 suspends monitoring of a VSWR based on the reflected wave. Therefore, the DPDC 11 does not update a bias value in the period from the time t51 to the time t52. Furthermore, the DPDC 11 does not update the LUT 3b-3 in the period from the time t51 to the time t52 regardless of the update cycle.

Upon completion of reception of the UL frame at the time t52, the base station device 10D sets the output of the transmission signal to ON. Furthermore, upon completion of reception of the UL frame at the time t52, the base station device 10D turns on the power of the amplifier 16. Moreover, upon completion of reception of the UL frame at the time t52, the switch 37 outputs, to the switch 38, the reflected wave output from the coupler 20. Furthermore, upon completion of reception of the UL frame at the time t52, the switch 38 switches between the feedback signal output from the coupler 17 and the reflected wave output from the switch 37 in a predetermined cycle. Consequently, the DPDC 11 resumes periodic monitoring of the VSWR based on the reflected wave. Furthermore, upon completion of reception of the UL frame at the time t52, the DPDC 11 updates the LUT 3b-3 in a predetermined update cycle.

Then, at a time t53, the DPDC 11 detects that the VSWR has changed from a value in a range of "1.0 to 1.1" to a value in a range of "1.1 to 1.2".

Then, in a period from the time t53 to a time t54, the DPDC 11 acquires a bias value associated with the new range of the VSWR from the memory 4a (see FIG. 2), and outputs a bias control signal indicating the acquired bias value to the bias output unit 25. The bias output unit 25 applies a bias voltage corresponding to the bias control signal to the carrier amplifier 16b and the peak amplifier 16d (see FIG. 1). Then, the DPDC 11 updates the LUT 3b-3 in the period from the time t54 to the time t55 that is a timing of a periodic update cycle.

Then, at a time t56, the DPDC 11 detects that the VSWR has changed from a value in the range of "1.1 to 1.2" to a value in the range of "1.2 to 1.3".

Furthermore, in a period from the time t56 to a time t57, the DPDC 11 acquires a bias value associated with a new range of the VSWR from the memory 4a, and outputs a bias control signal indicating the acquired bias value to the bias output unit 25. The bias output unit 25 applies a bias voltage based on the bias value corresponding to the bias control signal to the carrier amplifier 16b and the peak amplifier 16d. Then, the DPDC 11 updates the LUT 3b-3 in a period from the time t58 to a time t59 that is a timing of a periodic update cycle.

Even after the time t59, the DPDC 11 performs the processes at the times t51 and t52 every time a received signal is detected. Furthermore, even after the time t59, the DPDC 11 performs the processes at the times t53 to t55 every time a change in the bias value corresponding to the VSWR is detected.

Effect of Fourth Embodiment

In the fourth embodiment, even the base station device 10D to which TDD is applied performs distortion compensation based on a feedback signal, switches among a received signal, a reflected wave, and the feedback signal, and monitors a VSWR based on the reflected wave. Therefore, in the fourth embodiment, even the base station device 10D to which TDD is applied can reduce distortion remaining in the transmission signal subjected to the distortion compensation, similarly to the first embodiment. Consequently, the base station device 10D of the fourth embodiment can maintain the high quality of the transmission signal transmitted from the antenna 100 even when the characteristics of the antenna 100 is changed. Furthermore, the base station device 10D of the fourth embodiment periodically switches among the received signal, the reflected wave, and the feedback signal, and inputs one of them to the DPDC 11, so that it is possible to prevent expansion of the size of a circuit.

The functional units illustrated in each of the embodiments may be implemented by one or more of a CPU, an MPU, an NP, an ASIC, an FPGA, a PLD, and the like that execute a predetermined algorithm. NP is an abbreviation for a network processor, and MPU is an abbreviation for a micro processing unit. Furthermore, ASIC is an abbreviation for an application specific integrated circuit.

A predetermined program and predetermined data for implementing the functional units illustrated in each of the embodiments may be stored in a random access memory (RAM) or a flash memory. Alternatively, the predetermined program and the predetermined data for implementing the functional units illustrated in each of the embodiments may be stored in a storage device using an optical disk, a magnetic disk, or a magneto optical disk as a storage medium.

According to an aspect of the disclosed technology, it is possible to prevent degradation of distortion performance.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication device comprising:
   an antenna;
   a splitter;
   a memory; and
   a processor coupled to the memory, wherein the processor executes a process comprising:
   performing distortion compensation on a transmission signal based on a feedback signal;
   updating a distortion compensation coefficient used by the performing distortion compensation based on a bias voltage;
   amplifying the transmission signal subjected to the distortion compensation, wherein the amplified transmission signal is split by the splitter into a transmission signal output to the antenna and the feedback signal input;
   selecting an input from one of input of the feedback signal used by the performing distortion compensation and input of a reflected wave obtained by reflection of the split transmission signal;
   measuring an index based on the reflected wave when the selecting selects input of the reflected wave; and
   applying the bias voltage for controlling an efficiency of the amplifying in accordance with the measured index, wherein
   the applying changes the bias voltage to be applied to the amplifying to a bias voltage corresponding to the index currently measured by the measuring when the bias voltage corresponding to the index currently measured by the measuring is different from the bias voltage to be applied to the amplifying, and
   the updating updates the distortion compensation coefficient used by performing distortion compensation on the transmission signal, when the selecting selects input of the feedback signal.

2. A wireless communication device comprising:
   an antenna;
   a splitter;
   a memory; and
   a processor coupled to the memory, wherein the processor executes a process comprising:
   performing distortion compensation on a transmission signal based on a feedback signal;

updating a distortion compensation coefficient used by the performing distortion compensation based on a bias voltage;

amplifying the transmission signal subjected to the distortion compensation, wherein the amplified transmission signal is split by the splitter into a transmission signal output to the antenna and the feedback signal input, measuring an index based on a reflected wave obtained by reflection of the split transmission signal; and applying the bias voltage for controlling an efficiency of the amplifying in accordance with the measured index, wherein the performing performs the distortion compensation and the measuring measures the index in parallel with each other, and when the applying changes the bias voltage to be applied to the amplifying in accordance with the index, the updating forcibly updates the distortion compensation coefficient.

3. The wireless communication device according to claim 2, the process further comprising:

processing a received signal received by the antenna; and selecting an input from one of input of the received signal to the processing and input of the reflected wave to the measuring, wherein the performing performs the distortion compensation and the measuring measures the index in parallel with each other, the measuring measures the index when selecting selects input of the reflected wave, the applying changes the bias voltage to be applied to the amplifying to a bias voltage corresponding to the currently measured index when the bias voltage corresponding to the currently measured index is different from the bias voltage to be applied to the amplifying, and the updating forcibly updates the distortion compensation coefficient, when the applying changes the bias voltage to be applied to the amplifying in accordance with the measured index.

4. A wireless communication device comprising:

an antenna;

a splitter;

a memory; and a processor coupled to the memory, wherein the processor executes a process comprising:

performing distortion compensation on a transmission signal based on a feedback signal;

updating a distortion compensation coefficient used by the performing distortion compensation based on a bias voltage;

amplifying the transmission signal subjected to the distortion compensation, wherein the amplified transmission signal is split by the splitter into a transmission signal output to the antenna and the feedback signal input;

measuring an index based on a reflected wave obtained by reflection of the split transmission signal;

processing a received signal received by the antenna;

selecting an input from one of input of the received signal to the processing and input of the reflected wave to the measuring; and selecting the signal selected from the signal of the selected input and the feedback signal;

applying the bias voltage for controlling an efficiency of the amplifying in accordance with the measure index; and wherein the measuring measures the index based on the reflected wave obtained by reflection of the split transmission signal when input of the reflected wave is selected and the signal of the selected input is selected from the signal of the selected input and the feedback signal, the applying changes the bias voltage to be applied to the amplifying to a bias voltage corresponding to the currently measured index when the bias voltage corresponding to the currently measured index is different from the bias voltage to be applied to the amplifying, and when the applying changes the bias voltage to be applied to the amplifying in accordance with the measured index before the feedback signal is selected from one of the signal of the selected input and the feedback signal, the updating-updates the distortion compensation coefficient after the feedback signal is selected from one of the signal of the selected input and the feedback signal.

5. The wireless communication device according to claim 3, wherein when selecting selects input of the received signal, output of the transmission signal to the amplifying and power of the amplifying are set to off.

6. The wireless communication device according to claim 4, wherein when selecting selects input of the received signal, output of the transmission signal to the amplifying and power of the amplifying are set to off.

* * * * *